US011692283B2

(12) United States Patent
Anzalone et al.

(10) Patent No.: US 11,692,283 B2
(45) Date of Patent: Jul. 4, 2023

(54) APPARATUS FOR GROWING A SEMICONDUCTOR WAFER AND ASSOCIATED MANUFACTURING PROCESS

(71) Applicant: STMICROELECTRONICS S.r.l., Agrate Brianza (IT)

(72) Inventors: Ruggero Anzalone, Viagrande (IT); Nicolo' Frazzetto, San Giovanni la Punta (IT); Francesco La Via, Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 319 days.

(21) Appl. No.: 17/009,533

(22) Filed: Sep. 1, 2020

(65) Prior Publication Data
US 2021/0062361 A1 Mar. 4, 2021

(30) Foreign Application Priority Data

Sep. 3, 2019 (IT) .......................... 102019000015416

(51) Int. Cl.
*C30B 25/12* (2006.01)
*H01L 21/687* (2006.01)
*H01L 21/02* (2006.01)
*C23C 16/32* (2006.01)
*C23C 16/458* (2006.01)
(Continued)

(52) U.S. Cl.
CPC ............ *C30B 25/12* (2013.01); *C23C 16/325* (2013.01); *C23C 16/4583* (2013.01); *C30B 29/36* (2013.01); *C23C 16/4585* (2013.01); *C23C 16/46* (2013.01); *C30B 25/08* (2013.01); *H01L 21/0262* (2013.01); *H01L 21/02529* (2013.01);
(Continued)

(58) Field of Classification Search
CPC ......... C30B 25/12; C30B 29/36; C30B 25/08; C23C 16/325; C23C 16/4583; C23C 16/4585; C23C 16/46; H01L 21/68785; H01L 21/6875; H01L 21/02529; H01L 21/0262; H01L 21/67011
See application file for complete search history.

(56) References Cited

U.S. PATENT DOCUMENTS 3,108,818 A 10/1963 Furstenburg
3,922,712 A 11/1975 Stryker
(Continued)

OTHER PUBLICATIONS

U.S. Appl. No. 16/182,050, filed Nov. 6, 2018, Apparatus and Method for Manufacturing a Wafer.

*Primary Examiner* — David Vu
*Assistant Examiner* — Brandon C Fox
(74) *Attorney, Agent, or Firm* — Seed IP Law Group LLP

(57) ABSTRACT

An apparatus for growing semiconductor wafers, in particular of silicon carbide, wherein a chamber houses a collection container and a support or susceptor arranged over the container. The support is formed by a frame surrounding an opening accommodating a plurality of arms and a seat. The frame has a first a second surface, opposite to each other, with the first surface of the frame facing the support. The arms are formed by cantilever bars extending from the frame into the opening, having a maximum height smaller than the frame, and having at the top a resting edge. The resting edges of the arms define a resting surface that is at a lower level than the second surface of the frame. The seat has a bottom formed by the resting surface.

21 Claims, 6 Drawing Sheets

(51) Int. Cl.
  *C30B 29/36* (2006.01)
  *H01L 21/67* (2006.01)
  *C23C 16/46* (2006.01)
  *C30B 25/08* (2006.01)

(52) U.S. Cl.
  CPC ..... *H01L 21/67011* (2013.01); *H01L 21/6875* (2013.01); *H01L 21/68785* (2013.01)

(56) References Cited

U.S. PATENT DOCUMENTS

| | | |
|---|---|---|
| 5,923,408 A | 7/1999 | Takabayashi |
| 6,367,803 B1 | 4/2002 | Loth |
| 7,736,528 B2 | 6/2010 | Okita et al. |
| 9,406,504 B2 | 8/2016 | Frisina et al. |
| 10,475,673 B2 | 11/2019 | Anzalone et al. |
| 2008/0069951 A1 | 3/2008 | Chacin et al. |
| 2009/0255901 A1 | 10/2009 | Okita et al. |
| 2013/0109192 A1* | 5/2013 | Hawkins ........... C23C 16/45521 438/758 |
| 2013/0157448 A1 | 6/2013 | Frisina et al. |
| 2016/0133504 A1* | 5/2016 | Chu ................... C23C 16/4583 165/146 |
| 2017/0045828 A1 | 2/2017 | Van Sommeren et al. |
| 2017/0130335 A1* | 5/2017 | Yamada ............ C23C 16/45572 |
| 2018/0090350 A1 | 3/2018 | Anzalone et al. |
| 2018/0171471 A1* | 6/2018 | Takahashi ......... H01L 21/02381 |
| 2019/0080951 A1 | 3/2019 | Huston et al. |
| 2020/0144047 A1* | 5/2020 | Anzalone ........... H01L 21/0262 |
| 2020/0185220 A1* | 6/2020 | Daigo .................. C30B 25/165 |
| 2020/0234996 A1 | 7/2020 | Rokkam et al. |
| 2021/0233798 A1 | 7/2021 | Alaniz et al. |
| 2021/0263418 A1 | 8/2021 | Schouten et al. |

* cited by examiner

APPARATUS FOR GROWING A SEMICONDUCTOR WAFER AND ASSOCIATED MANUFACTURING PROCESS

BACKGROUND

Technical Field

The present disclosure relates to an apparatus for growing a semiconductor wafer, such as a silicon carbide wafer, and to an associated manufacturing process.

Description of the Related Art

Semiconductor devices are typically manufactured in silicon wafers. However, silicon-carbide (SiC) wafers have become increasingly popular due, at least in part, to the favorable chemical-physical properties of SiC. For instance, SiC generally has a wider band gap than silicon. Consequently, SiC, also with relatively thin thicknesses, has a higher breakdown voltage than silicon and may therefore be advantageously used in high-voltage applications, such as in power devices.

Silicon carbide exists in different crystallographic forms or polytypes. The most common polytypes are the cubic polytype (polytype 3C—SiC), the hexagonal polytype (polytypes 4H—SiC and 6H—SiC) and the rhombohedral polytype (polytype 15R—SiC). Amongst these, currently the cubic polytype 3C—SiC has been the subject of in-depth study, due to its unique properties as compared to other wafer polytypes. For instance, generally 3C—SiC wafers have a lower trap density on the $SiO_2/3C$—SiC interface and a greater channel-electrons mobility. Other interesting characteristics of 3C—SiC are the low value of ON-state resistance $R_{on}$, which is particularly useful in case of devices working up to and beyond 650 V.

However, manufacturing of silicon-carbide wafers is more complex than that of silicon wafers and, currently, 3C—SiC substrates are not available on the market.

An apparatus and a method for manufacturing a SiC silicon-carbide wafer are described in the US 2013/0157448 entitled "Method for manufacturing a silicon carbide wafer and respective equipment", filed in the name of the present applicant. This patent application describes a method for manufacturing the SiC wafer including positioning a silicon substrate on a support (referred to as "susceptor") in a reaction chamber, growing a 3C—SiC epitaxial layer on the silicon substrate, and then separating the silicon substrate from the 3C—SiC epitaxial layer by melting the silicon substrate. The molten silicon is then drained off through a pair of discharge openings underneath the susceptor.

To improve the separation of the silicon substrate from the 3C—SiC epitaxial layer, the present applicant has developed an improved reaction chamber, described in US 2018/0090350 and entitled "Apparatus for manufacturing a silicon carbide wafer." Here, the susceptor is formed by a plurality of bars having a tilted shape or facing downwards to favor the flow of the molten silicon through the openings between the bars. Moreover, a sponge is arranged in a cup-shaped container, underneath the support to collect the molten silicon and simplify the removal thereof from the reaction chamber.

A further improvement is described in U.S. patent application Ser. No. 16/182,050 filed on 6 Nov. 2018, entitled "Apparatus and method for manufacturing a wafer." Here, the susceptor comprises an outer frame defining an opening and bearing a plurality of arms that extend from the frame towards the inside of the opening and are suspended over a container. The arms are cantilevered, are fixed at one end to the frame and have one free end orientated towards the center of the opening. The free end is provided with a tip projecting upwards.

In some cases, during fabrication of a silicon-carbide wafer, part of the silicon adheres to, for example, the arm tips of a susceptor and remains attached thereto. In addition, it has been verified that, in some situations, the silicon-carbide wafer does not grow uniformly, but forms a polycrystalline outer edge.

BRIEF SUMMARY

Various embodiments of the present disclosure provide an improved apparatus and process that overcome the drawbacks of the prior art and enable manufacture of silicon-carbide wafers, even of large dimensions.

According to the present disclosure, an apparatus and a process for growing a silicon-carbide wafer are provided.

In practice, the present apparatus comprises a support formed by a frame, an opening in the frame, and by a plurality of arms extending into the opening, towards the center thereof. The arms define a resting surface for a wafer that is at a lower level than the frame.

In fact, studies conducted by the present applicant have shown that, during SiC growing, obtained by induction in a CVD (Chemical-Vapor Deposition) type reactor on the silicon substrate, the distribution of the heat within the reaction chamber is not uniform, but the edge of the wafer is colder than the center by a few tens of degrees. The present applicant has supposed that this temperature gradient is due to the instability of the flow of the growth gases, which should lap, in a laminar way, the initial silicon wafer and the first thin SiC layer growing on the silicon substrate. Since the initial silicon wafer is at higher level and projects from the substrate, it has been supposed that this causes an instability in the growth gas flow, and consequently a temperature gradient is generated.

To solve the above problem, then, the support is manufactured so that the supporting arms are arranged at a lower level than the frame and the initial silicon wafer is arranged within the frame so that its top surface is approximately aligned with that of the frame.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

Figure 1:
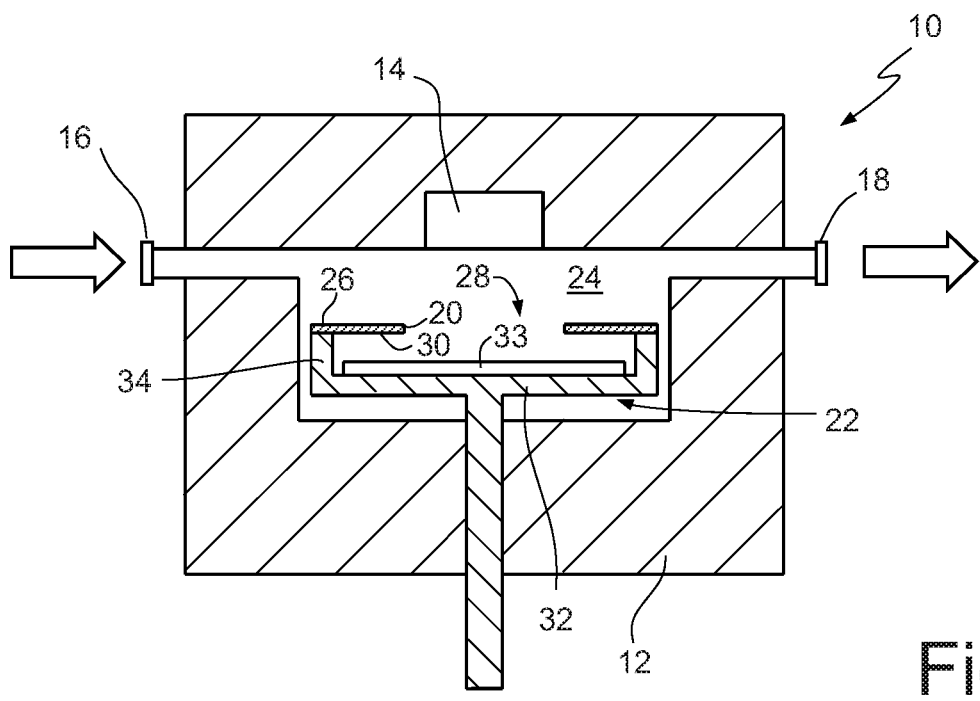
FIG. 1 is a cross-section of an embodiment of the present apparatus.

FIG. 1 shows an apparatus 10 for growing a silicon-carbide wafer. The apparatus 10 comprises a body 12, a heater 14, an inlet duct 16, an outlet duct 18, a support 20 (also referred to as "susceptor") and a container 22, for example, cup-shaped.

The body 12 forms a reaction chamber 24 delimiting a closed space where the reactions take place. The susceptor 20 and the container 22 are positioned within the reaction chamber 24. The body 12 is generally of thermally insulating material, and thermally insulates the reaction chamber 24 from the external environment.

The heater 14 is coupled to the body 12, for example, arranged facing the reaction chamber 24. The heater 14 heats the reaction chamber 24 and what is contained inside the reaction chamber 24 (for example, the susceptor 20, the container 22, gas, substrates, wafers, or other objects or substances). The heater 14 may be produced in any way. For instance, the heater 14 may be an inductive heater that includes a plurality of coils; or a resistive heater that includes resistors covered with carbide or some other type of heating device.

The inlet duct 16 provides a fluidic path from the environment external to the apparatus 10 to the reaction chamber 24 and can be used for introducing precursors and gas into the reaction chamber 24, as discussed below.

The outlet duct 18 provides a fluidic path from the reaction chamber 24 to the outside of the apparatus 10. It may also be used for outside discharging reaction gases formed in the reaction chamber 24, as discussed below.

In particular, in the apparatus 10, the reaction chamber 24 is of a horizontal-flow type. To this end, as shown, for example, in FIG. 1, the inlet duct 16 and the outlet duct 18 are horizontally aligned to each other and the gases flow longitudinally along a top surface of the susceptor 20.

The susceptor 20 is arranged over the container 22 and in the reaction chamber 24. The susceptor 20 forms a platform for receiving and holding a substrate or a wafer, within the reaction chamber 24. In particular, as discussed below, a silicon substrate is arranged on the susceptor 20 during the manufacture of a SiC wafer.

As discussed in detail hereinafter with reference to FIGS. 2-7, the susceptor 20 includes a frame 26 positioned above and supported by the container 22, to carry a substrate to be processed, here a monocrystalline silicon substrate, as discussed in detail with reference to FIGS. 9-13; an opening 28 surrounded and defined by the frame 26; and a plurality of arms 30 extending from the frame 26 towards the inside of the opening 28, for supporting the silicon substrate thereon.

The container 22 is arranged in the reaction chamber 24, directly underneath the susceptor 20. The susceptor 20 rests on the container 22 so that the material being discharged through the opening 28 of the susceptor 20 during operation of the apparatus 10 (molten silicon) may be collected by the container 22. The container 22 includes a base 32 and a side wall 34. The base 32 extends directly underneath the opening 28 and the arms 30 of the susceptor 20. The base 32 carries a sponge 33, as described in US 2018/0090350, cited above. The side wall 34 of the container 22 is arranged directly underneath the frame 26 of the susceptor 20.

Figure 2:
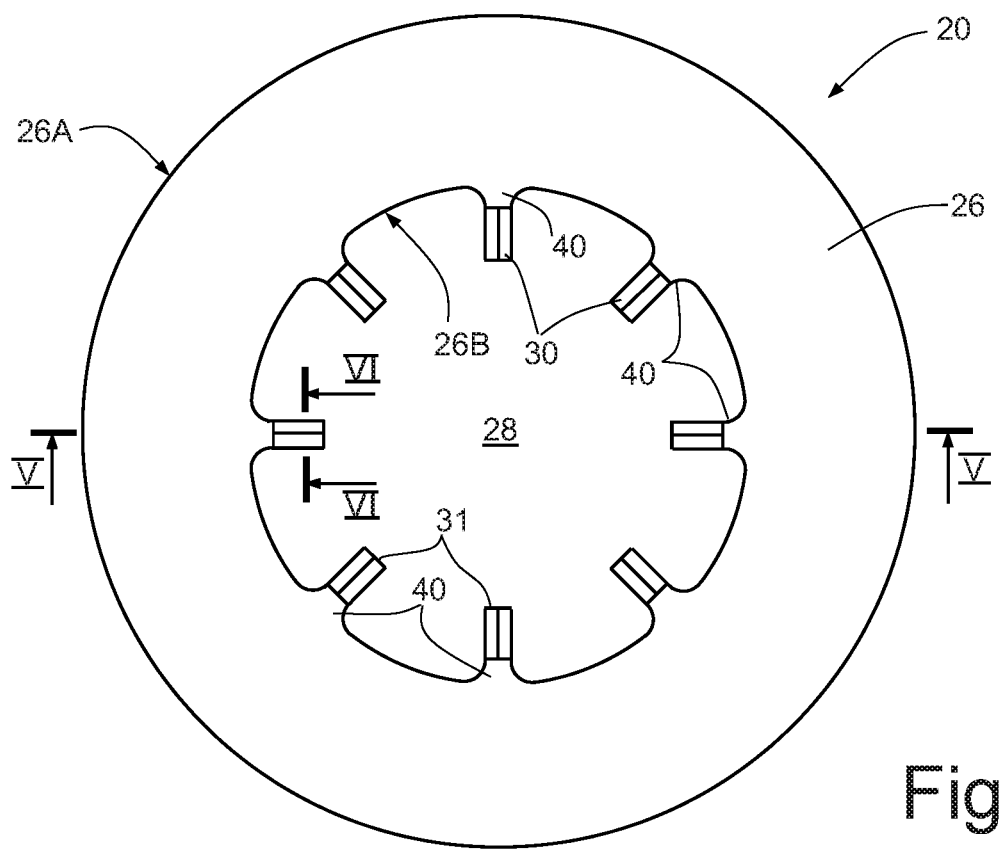
FIG. 2 is a top view of an embodiment of a support usable in the apparatus of FIG. 1.
Figure 3:
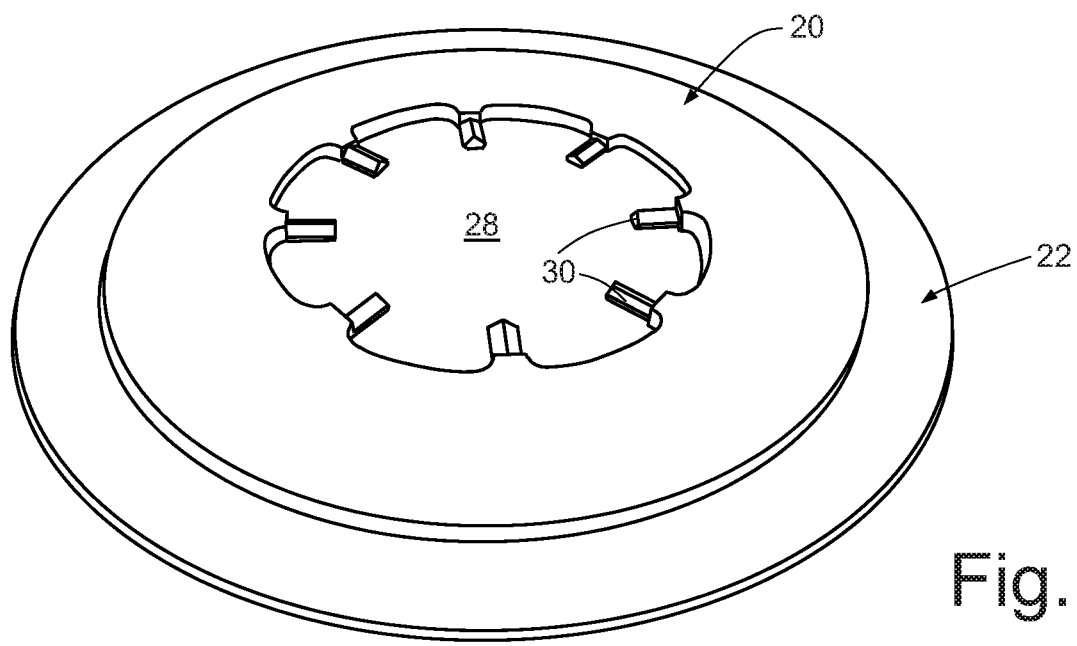
FIG. 3 is a perspective view from above of the support of FIG. 2.
Figure 4:
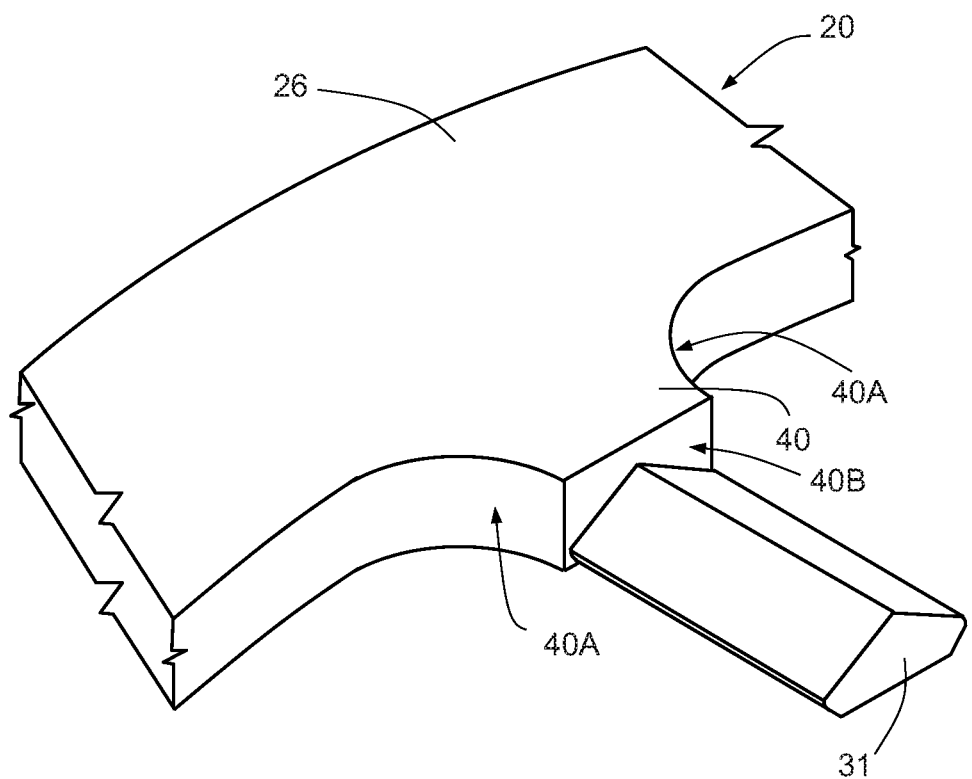
FIG. 4 is an enlarged perspective view of a detail of the support of FIG. 2.
Figure 5:
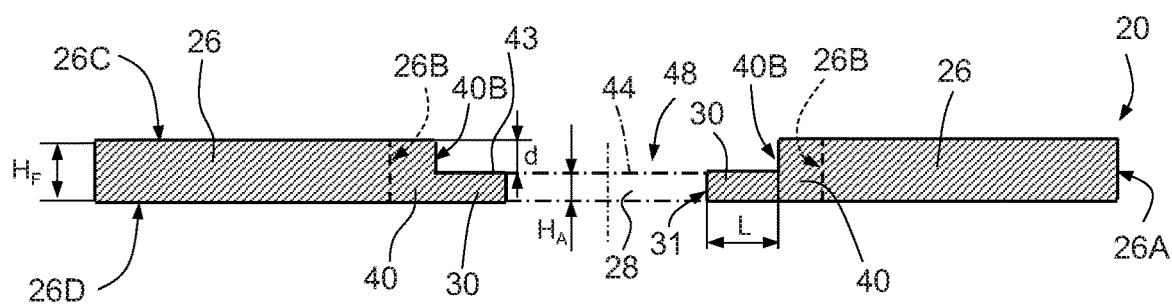
FIG. 5 is a cross-section of the support of FIG. 2, taken along section line V-V of FIG. 2.
Figure 6:
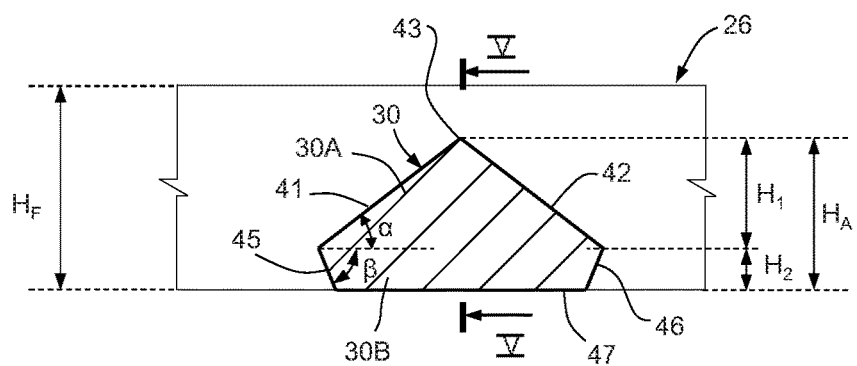
FIG. 6 is a cross-section through a part of the support of FIG. 2, taken along section line VI-VI of FIG. 2.

FIGS. 2-6 show a susceptor 20 that may be used in the apparatus 10. FIG. 2 is a top view of an embodiment of the susceptor 20. FIG. 3 is a perspective view from above of the support 20. FIG. 4 is an enlarged perspective view of a detail of the support 20. FIG. 5 is a cross-section of the support 20 taken along section line V-V of FIG. 2. FIG. 6 is a cross-section through a part of the support 20 taken along section line VI-VI of FIG. 2.

In detail, as mentioned above, the susceptor 20 includes the frame 26, the opening 28, and a plurality of arms 30, provided as a single piece.

The frame 26 has a generally annulus shape, delimited externally by an outer wall 26A, internally by an inner wall 26B, at the top by a top surface 26C, and at the bottom by a bottom surface 26D. The outer wall 26A is here cylindrical and has a diameter correlated to the reaction chamber 24; the inner wall 26B has a generally cylindrical shape, the diameter whereof depends upon the size of the wafers that are to be obtained, just slightly larger than the wafer diameter, as explained below. The bottom surface 26D is carried by the container 22, and the top surface 26C, opposite to the bottom surface 26D, here defines a reference plane. In one embodiment, the frame 26 moreover has a constant height $H_F$, depending upon the used reaction chamber 24 and usually less than 1 cm, for example, less than 0.5 cm.

The frame 26 moreover has a plurality of projections 40 extending radially from the inside of the opening 28 towards the center and at a uniform distance from each other. In the embodiment of FIGS. 2-6, for instance, the frame 26 has eight projections 40, each delimited by arched walls 40A having convexity facing the opening 28 and by a transverse wall 40B extending between the arched walls 40A. The projections 40 here have the same thickness as the frame 26. The transverse walls 40B (of a planar or slightly arched shape) define, as a whole, an approximately cylindrical virtual wall having a diameter substantially equal to or, at the most, slightly larger than the diameter of the semiconductor wafer to be grown (e.g., 5 to 10 μm larger than the diameter of the semiconductor wafer), as explained below.

The projections 40 may be missing, in which case the cylindrical wall formed by the surface portions 40A coincides with the inner wall 26B of the frame.

The arms 30 are bar-shaped, linear, extend in cantilever fashion from the projections 40, one for each projection, radially towards the center of the opening 28, and have a free end 31 suspended over the container 22. In detail, here each arm 30 has a cross-section (according to a plane parallel to the planes tangential to the inner and outer surfaces 26A, 26B of the frame 26) shaped as a non-equilateral pentagon, as shown in FIG. 6. Specifically, the cross-section of the arms 30 is here formed by a top portion 30A with a triangular-shaped and by a bottom portion 30B with an upside down-turned trapezium shape (with the major base forming the base of the triangular shape of the top portion 30A). In practice, the top portion 30A of each arm 30 is delimited by two top inclined sides 41, 42, and the bottom portion 30B of each arm 30 is delimited by two bottom inclined sides 45, 46 and by a bottom side or base 47. The two top inclined sides 41, 42 of each arm 30 join up (in the ideal representation of FIG. 6) along a vertex or vertex line 43 even though, in a practical embodiment, the arms 40 have at the top a more or less rounded vertex portion surface.

In the embodiment shown, the top inclined sides 41, 42 have an inclination angle α (with respect to a plane passing through the bases of the top portion 30A and bottom portion 30B) that is smaller than the bottom inclined sides 45, 46 (inclination angle β), thus favoring flow of molten material, as explained in detail hereinafter with reference to the manufacturing process represented in FIGS. 9-13.

In one embodiment, in longitudinal section, along the vertex line 43 (shown in FIG. 5), the arms 30 have a constant height $H_A$, smaller than height $H_F$ of the frame 26. In particular, distance $d=H_F-H_A$ is approximately equal to a height or thickness of a substrate to be inserted into the frame 26 (e.g., 5 to 10 µm smaller or larger the height of the substrate), as discussed in detail hereinafter. For instance, the distance d may be at least 60-70 µm, in particular comprised between 200 and 300 µm.

In one embodiment, the arms 30 moreover all have the same length L, starting from the projections 40.

In particular, the arms 30 may have a length L comprised between 11 mm and 13 mm, for example, approximately 12 mm; a height $H_A$ depending upon the geometry of the reaction chamber and comprised, for example, between 0.3 and 0.7 cm, in particular approximately 0.5 cm; a height H1 of the top portion 30A greater than the height H2 of the bottom portion 30B; maximum inclination angles α and β according to the limits imposed by the manufacturer, where the sum α+β may be comprised between 110° and 150° (where in general β>α, as mentioned above).

The vertex lines 43 of the arms 30 define a virtual resting surface 44 that, together with the wall defined by the side surfaces 40B of the projections 40, forms a lowered seat 48 for a semiconductor wafer to be grown, as explained in detail hereinafter with reference to FIGS. 9-13.

The susceptor 20, and in particular the arms 30, may be coated with a coating that counters adhesion of any possible material (in particular, molten silicon, as discussed below). For instance, the coating may be of silicon carbide.

Figure 7:
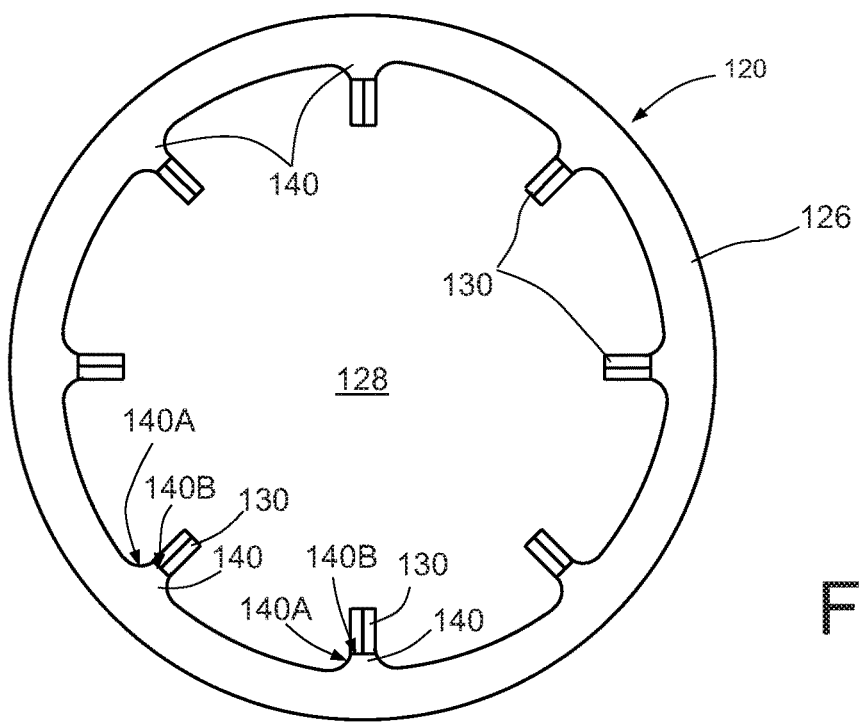
FIG. 7 is a top view of another embodiment of a support usable in the apparatus of FIG. 1.

FIG. 7 is a top view of another embodiment of a support usable in the apparatus of FIG. 1. In particular, FIG. 7 shows a susceptor 120 designed for manufacturing wafers of 6" diameter. The susceptor 120 of FIG. 7 has a general structure similar to the susceptor 20 of FIG. 2, with arms 130 orientated towards the inside of the opening (here designated by 128), but the opening 128, and in particular the cylindrical wall formed by the surface portions (here designated by 140A) of the projections (here 140) has larger dimensions, to be able to receive the wafer.

Figure 8:
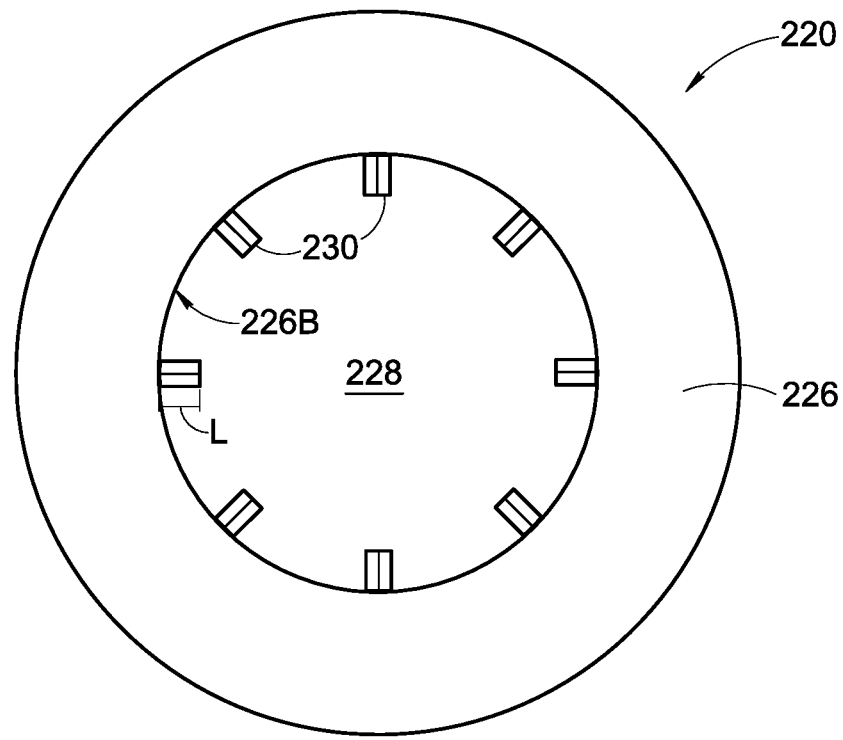
FIG. 8 is a top view of another embodiment of a support usable in the apparatus of FIG. 1.
Figure 9:
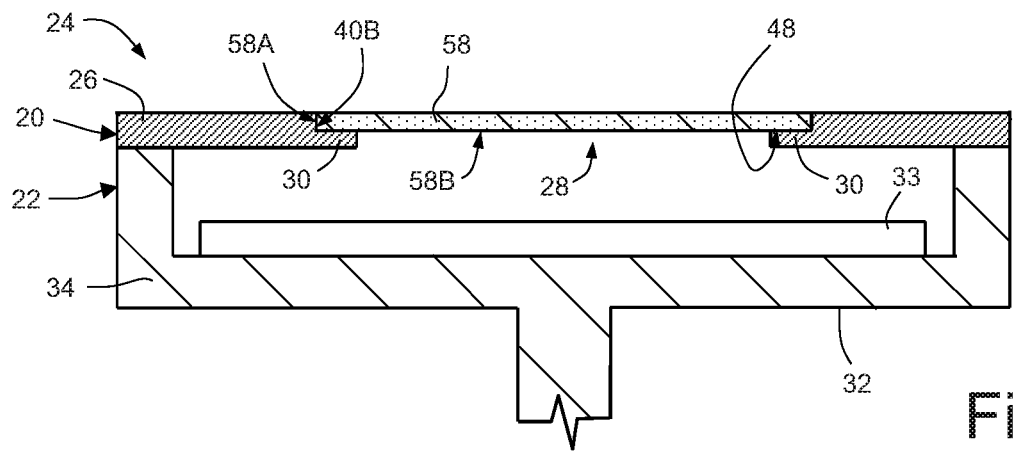
FIGS. 9-13 are cross-sections showing successive steps for manufacturing a semiconductor wafer using the apparatus of FIG. 1.

FIG. 8 is a top view of another embodiment of a support usable in the apparatus of FIG. 1. In particular, FIG. 8 shows a susceptor 220, which has a structure similar to the susceptor 20 of FIG. 2. For example, the susceptor 220 includes arms 230 that extend from a frame 226 and towards a center 228. However, in contrast to the susceptor 20 of FIG. 2, the arms 230 of the susceptor 220 are shorter in length than the arms 30 of the susceptor 20. In one embodiment, each of the arms 230 has a length L that is between 4 mm and 11 mm. In addition, in contrast to the susceptor 20 of FIG. 2, the susceptor 220 does not include projections (e.g., the projections 40) that extend radially from the inside of the opening 228 towards the center. Instead, the arms 230 are attached to and extend directly from an inner wall 226B of the frame 226. The reduced length of the arms 230 and the removal of projections allows manufacturing larger sized wafers compared to the susceptor 20.

FIGS. 9 to 13 show an embodiment of a process for manufacturing a silicon carbide wafer, in particular a SiC-3C wafer, using the apparatus 10 of FIG. 1. In these figures, the body 12, the heater 14, the inlet duct 16, and the outlet duct 18 are not shown, for simplicity. Moreover, again for simplicity, reference will be made to the susceptor 20 of FIGS. 2-6, but what mentioned also applies to the susceptor 120 of FIG. 7.

In detail (FIG. 9), a substrate 58 of a first material, here a silicon substrate, is positioned in the reaction chamber 24, and precisely in the seat 48 of the susceptor 20. The substrate 58 is inserted, almost force-fitted, into the seat 48, with its own edge 58A in contact with the surface portions 40B of the projections 40, on the arms 30, so that its bottom surface 58B is in contact with the vertex 43 of the top portions 30A of the arms 30, on the virtual resting surface 44.

The substrate 58 has a thickness that is as thin as possible, compatibly with brittleness. For instance, the substrate 58 may have a thickness of at least 60-70 µm, in particular comprised between 200 µm and 300 µm.

As mentioned above, since the distance d between the virtual resting surface 44 and the reference plane 26C is approximately equal to the thickness of the substrate 58, the top surface of the latter sets approximately level with the reference plane formed by the top surface 26C of the frame 26, and the substrate 58 does not project substantially in height from the opening 28.

The substrate 58 generally has a crystalline structure. Moreover, in this step, the reaction chamber 24 is at room temperature.

Once the substrate 58 is positioned in the susceptor 20, the reaction chamber 24 is sealed and heated by the heater 14 to a first temperature. For instance, the first temperature may be comprised between 450° C. and 550° C. Moreover a first pressure level, for example, comprised between $8·10^{-5}$ and $12·10^{-5}$ bar, is set in the reaction chamber 24.

After the reaction chamber 24 has been heated to the first temperature, it is brought to a second temperature, higher than the first temperature. For instance, the second temperature may be comprised between 1050° C. and 1150° C. Moreover a second pressure level, higher than the first pressure level, for example, comprised between 75 and 125 mbar, is set in the reaction chamber 24.

The reaction chamber 24 is kept at the second pressure level for the rest of the process.

After the reaction chamber 24 has been heated to the second temperature, the substrate 58 is immersed in hydrogen ($H_2$). Hydrogen is introduced into the reaction chamber 24 through the inlet duct 16. Moreover, the substrate 58 is subjected to carbonization operations by introducing carbon based precursor into the reaction chamber 24 through the inlet duct 16. The carbon-based precursor carbonizes the surface silicon atoms of the substrate 58 to form a thin SiC layer, as 3C—SiC, having a thickness, for example, in the region of a few nanometers. This is frequently referred to as ramp carbonization. As will be discussed hereinafter, the thin SiC layer acts as seed for growing SiC.

The reaction chamber 10 is then heated by the heater 14 to a third temperature, higher than the second temperature. For instance, the third temperature is comprised between 1340° C. and 1400° C.

Again with reference to FIG. 9, while the reaction chamber 24 is brought to the third temperature or after it has reached the third temperature, a carbon-based precursor and a silicon based one is introduced into the reaction chamber 24 through the inlet duct 16.

In this step, due to the arrangement of the substrate 58 within the seat 48, with its top surface flush with the top surface 26C of the frame 26, the gases flow, lapping the substrate 58 (or the wafer being grown) with an approximately laminar motion. This makes it possible to have a more uniform flow of gases and a distribution of temperature more constant as compared known apparatuses.

The constant distribution of the temperature is also favored by the fact that, in this step, as in the subsequent growing steps and in the preliminary heating steps, in a per se known and not shown manner, the susceptor 20 is made to turn within the reaction chamber 24. In this way, the substrate 58 is lapped by the introduced gases, starting from the entire circumference, and therefore in a way as uniform as possible during growth.

Figure 10:
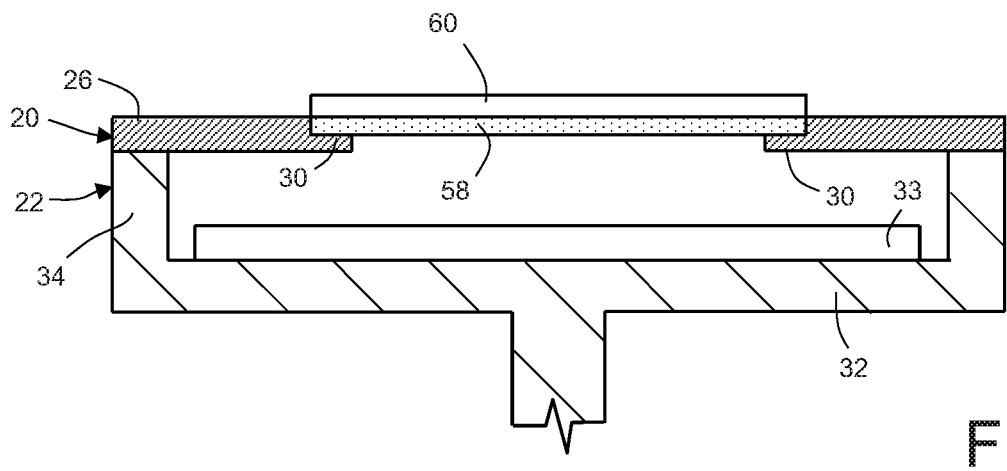

Consequently, a first SiC layer 60 starts to grow in an epitaxial way from the thin SiC layer, as shown in FIG. 10. This step is frequently defined as hetero-epitaxial growth.

Figure 11:
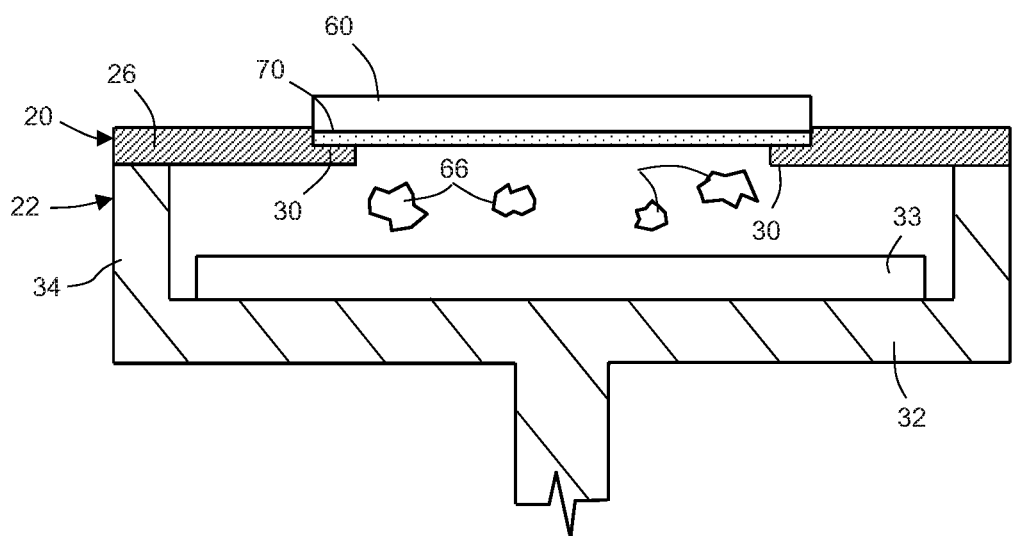

Next, maintaining a flow of $H_2$ in the reaction chamber 24 through the inlet duct 16, a melting process is carried out. In particular, the reaction chamber 24 is heated by the heater 14 up to a fourth temperature, higher than the melting point of the substrate 58 and lower than the melting point of the first SiC layer 60. For instance, the fourth temperature is comprised between 1550° C. and 1650° C. Consequently, as shown in FIG. 11, the substrate 58 melts and deposits in the container 22, being absorbed by the sponge 33. In particular, the molten silicon (designated by 66 in FIG. 11) coming from the substrate 58 flows along the top inclined sides 41, 42 of the arms 30, flows along the bottom inclined sides 45, 46 of the arms 30, and drops from the susceptor 20 onto the bottom of the container 22, where it is collected and absorbed by the sponge 33.

In this step, the minimum area of contact between the susceptor 20 and the substrate 58 (at the vertex 43 of the top portion 30A of the arms 30) and the inclination of the top and bottom inclined sides 41, 42, 45, 46 favor flow of the molten silicon 66 from the substrate 58. In fact, when the substrate 58 is molten, the surface tension between the susceptor 20 and the molten silicon 66 is reduced. Moreover, the presence of the bottom inclined sides 45, 46 favors dropping of the molten silicon 66 from the top inclined sides 41, 42 directly downwards. Consequently, it is less likely for the molten silicon 66 to attach or adhere to the arms 30; instead, it tends to detach from the susceptor 20 and to flow towards the bottom of the container 22.

The fact that the top inclined sides 41, 42 extend throughout the length of the arms 30 enables detachment of the molten silicon 66 from the entire bottom surface 58A of the substrate 58.

The reaction chamber 24 can be maintained at the fourth temperature until all the substrate 58 is removed from the first SiC layer 60.

Alternatively, as shown in FIG. 11, the fourth temperature of the reaction chamber 24 can be maintained until small portions or a thin residual layer 70 of the substrate 58 remain/remains on the susceptor 20. In this embodiment, as discussed hereinafter with reference to FIG. 13, the residual layer 70 of the substrate 58 is removed by a chemical-etching process.

Figure 12:
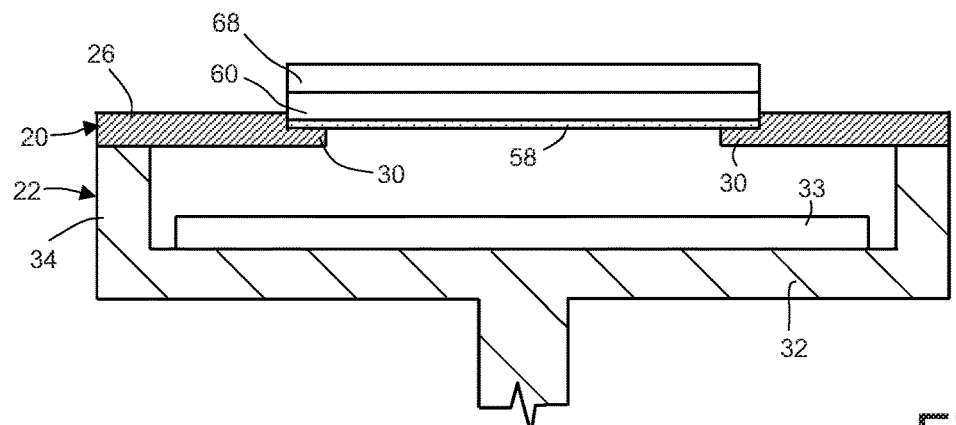

In FIG. 12, a silicon- and carbon-based precursor is introduced into the reaction chamber 24 through the inlet duct 16. Therefore, the first SiC layer 60 continues to grow in thickness; i.e., a second SiC layer 68 starts to grow on the first SiC layer 60. This step is frequently referred to as homo-epitaxial growth. The silicon- and carbon-based precursor can be supplied during the substrate 58 melting step. Alternatively, the silicon- and carbon-based precursor is supplied after the process of melting of the substrate 58 is completed.

When the second SiC layer 68 reaches a desired thickness, the flow of the silicon- and carbon-based precursor is stopped. Possible reaction gases in the reaction chamber 24 are removed from the reaction chamber 24 through the outlet duct 18 (FIG. 1).

As mentioned previously, if the SiC wafer contains residual portions 70 of the substrate 58, these are removed via a chemical-etching process during growth of the second SiC layer 68 or at the end of such growth. In this case, a chemical-etching gas, such as hydrochloric acid (HCl), is introduced into the reaction chamber 24 through the inlet duct 16 (FIG. 1). The residual portions 70 of the substrate 58 once again coupled to the first SiC layer 60 are therefore removed by the chemical-etching gas and generally removed through the outlet duct 18 (FIG. 13).

Once the residual portions 70 of the substrate 58 have been removed, the reaction chamber 10 is turned off, vented, and brought back to a lower temperature (e.g., room temperature). The resulting SiC wafer 72 can then be immersed in $H_2$ or Ar.

Figure 13:
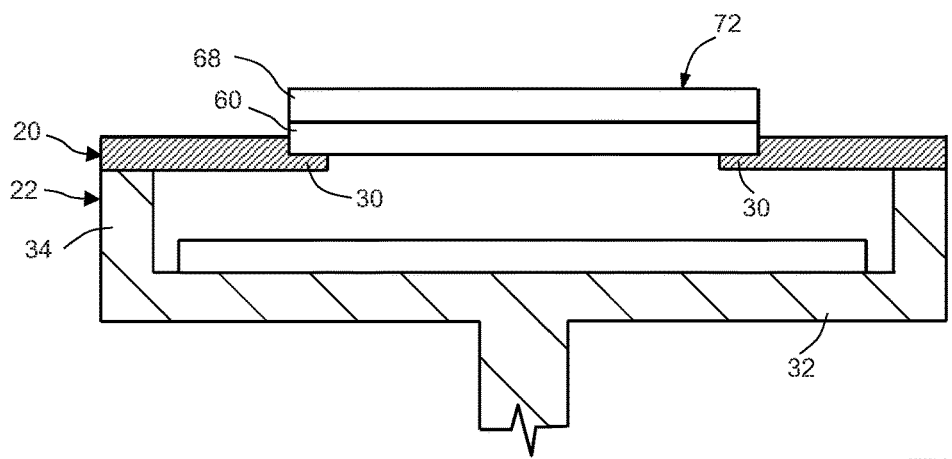
Figure 14:
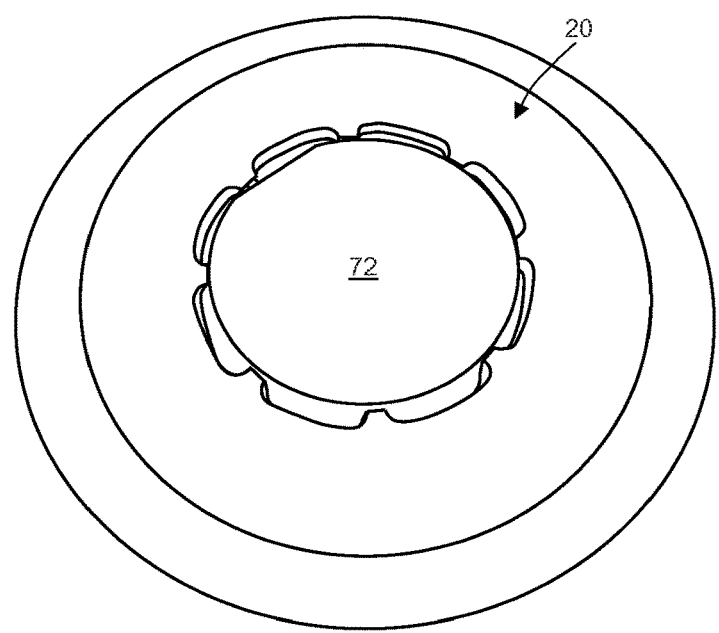
FIG. 14 is a perspective view of the substrate of FIGS. 2-4 with a semiconductor wafer obtained at the end of the manufacturing process.

FIG. 13 shows a SiC wafer 72 thus obtained on the susceptor 20.

Therefore, with the described apparatus and process, since the frame 26 is very close to the wafer that is being grown and this, initially, does not project at the top from the susceptor, it is possible to obtain a better temperature distribution and to reduce flow instability, enabling growth of SiC wafers that are substantially mono-crystalline throughout their diameter and without polycrystalline edge areas.

Moreover, by virtue of the shape of the arms 30 and to their limited number, detachment of the silicon can come about in a more reliable and complete way as compared to known solutions.

Consequently, it becomes possible to manufacture SiC wafers of large dimensions, even larger than 6", for example, 8", up to 12", even though the process and apparatus operate reliably and advantageously also for the manufacture of wafers of smaller dimensions, such as 2", 4 and 6" wafers.

Finally, it is clear that modifications and variations may be made to the apparatus and to the process described and shown herein, without thereby departing from the scope of the present disclosure. For instance, the various embodiments described may be combined so as to provide further solutions.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus, comprising:
  a chamber;
  a collection container in the chamber; and
  a support in the chamber and over the collection container,
    the support including a frame, an opening surrounded by the frame, a plurality of arms, and a seat within the opening,
    the frame having a first surface and a second surface, opposite to each other,
    the first surface of the frame facing the collection container,
    the arms being cantilever bars extending from the frame into the opening, each of the arms having a maximum height that is smaller than a maximum height of the frame, and a resting edge, each of the arms includes an upper portion delimited by a pair of upper inclined sides that are contiguous and intersect to form a vertex, the resting edges of the arms defining a resting surface that is at a lower level than the second surface of the frame, the seat having a bottom formed by the resting surface.

2. The apparatus according to claim 1, wherein the resting surface is positioned at a distance from the second surface substantially equal to a thickness of a substrate to be inserted in use into the seat.

3. The apparatus according to claim 1, wherein the resting surface is positioned at a distance from the second surface.

4. The apparatus according to claim 1, wherein each of the arms includes a lower portion delimited by a pair of lower inclined sides.

5. The apparatus according to claim 4, wherein each of the arms has a pentagonal cross-section.

6. The apparatus according to claim 4, wherein the lower inclined sides have an inclination, with respect to a plane parallel to the resting surface, that is greater than an inclination of the upper inclined sides.

7. The apparatus according to claim 1, further comprising:

a plurality of projections extending from the frame into the opening, each of the plurality of projections having connection walls extending transversely from the frame, and a transverse wall extending between the connection walls, the transverse walls forming, together with the resting surface, the seat, each of the arms extending from a respective transverse wall.

8. A method, comprising:

positioning a substrate of a first material in an apparatus, the apparatus including a chamber, a collection container in the chamber, and a support in the chamber and over the collection container, the support including a frame, an opening surrounded by the frame, a plurality of arms, and a seat within the opening, the frame having a first and a second surface, opposite to each other, the first surface of the frame facing the collection container, the arms being cantilever bars extending from the frame into the opening, each of the arms having a maximum height that is smaller than a maximum height of the frame, and a resting edge, each of the arms includes an upper portion delimited by a pair of upper inclined sides that are contiguous and intersect to form a vertex, the resting edges of the arms defining a resting surface at a lower level than the second surface of the frame, the seat having a bottom formed by the resting surface, the substrate being positioned in the seat and approximately flush with the frame;

forming a layer of a second material on the substrate, the layer of the second material having a first thickness;

successively separating at least one first portion of the substrate from the layer of the second material by melting the first portion of the substrate; and growing the layer of the second material until the layer of the second material has a second thickness that is greater than the first thickness.

9. The method according to claim 8, further comprising:

after growing the layer of the second material, separating a second portion of the substrate from the layer of the second material by chemical etching.

10. The method according to claim 8, wherein the second material includes silicon carbide, and the first material includes silicon.

11. A support, comprising:

a frame including a first surface and a second surface opposite to the first surface, the first surface being spaced from the second surface by a first distance;

an opening in the frame; and a plurality of arms extending in to the opening, each of the plurality of arms being cantilevered from the frame, each of the plurality of arms including a base, a first angled surface, a second angled surface, and a vertex, the first angled surface and the second angled surface forming the vertex, the base being spaced from the vertex by a second distance smaller than the first distance.

12. The support of claim 11, wherein each of the plurality of arms includes a third angled surface and a fourth angled surface, the third angled surface couples the first angles surface to the base, and the fourth angled surface couples the second angled surface to the base.

13. The support of claim 12, wherein an angle between the first angled surface and a plane is smaller than an angle between the plane and the third angled surface, and the plane extends through the plurality of arms and is parallel to the first surface of the frame.

14. The support of claim 11, wherein the bases of the plurality of arms are coplanar with the second surface of the frame.

15. The support of claim 11, wherein the vertex is positioned lower than the first surface of the frame.

16. The support of claim 11, wherein the plurality of arms extend from the frame towards a center of the opening.

17. The support of claim 11, wherein a difference between the first distance and the second distance is substantially equal to a substrate to be positioned on the plurality of arms.

18. The support of claim 11, further comprising:

a plurality of projections that physically couple the plurality of arms to the frame, the plurality of arms extending from sidewalls of the plurality of projections towards a center of the opening.

19. An apparatus, comprising:

a chamber;

a collection container in the chamber;

a support in the chamber and over the collection container, the support including a frame, an opening surrounded by the frame, a plurality of arms, and a seat within the opening; and a plurality of projections extending from the frame into the opening, the frame having a first surface and a second surface, opposite to each other, the first surface of the frame facing the collection container, the arms being cantilever bars extending from the frame into the opening, each of the arms having a maximum height that is smaller than a maximum height of the frame, and a resting edge, the resting edges of the arms defining a resting surface that is at a lower level than the second surface of the frame, the seat having a bottom formed by the resting surface, each of the plurality of projections having connection walls extending transversely from the frame, and a transverse wall extending between the connection walls, the transverse walls forming, together with the resting surface, the seat, each of the arms extending from a respective transverse wall.

20. The apparatus according to claim 19, wherein each of the arms includes an upper portion delimited by at least one inclined side, and the inclined side of each arm has a non-zero inclination with respect to the resting surface.

21. The apparatus according to claim 19, wherein each of the arms has a pentagonal cross-section.

\* \* \* \* \*